United States Patent
Blankenship et al.

(10) Patent No.: US 6,727,835 B2
(45) Date of Patent: Apr. 27, 2004

(54) ANALOG MULTIPLEX LEVEL SHIFTER WITH RESET

(75) Inventors: Tim Blankenship, Austin, TX (US); Stephen Bily, Austin, TX (US)

(73) Assignee: Winbond Electronics Corporation, Taiwan (CH)

(*) Notice: Subject to any disclaimer, the term of this patent is extended or adjusted under 35 U.S.C. 154(b) by 0 days.

(21) Appl. No.: 10/109,634

(22) Filed: Apr. 1, 2002

(65) Prior Publication Data

US 2002/0154044 A1 Oct. 24, 2002

Related U.S. Application Data

(60) Provisional application No. 60/280,677, filed on Mar. 30, 2001.

(51) Int. Cl.[7] .................................................. H03M 1/66
(52) U.S. Cl. ....................................... 341/144; 341/145
(58) Field of Search .................................. 341/144, 118, 341/120

(56) References Cited

U.S. PATENT DOCUMENTS

| | | | |
|---|---|---|---|
| 5,296,755 A | * 3/1994 | Miyamoto et al. ............ 307/446 |
| 5,465,054 A | 11/1995 | Erhart ............................ 326/34 |
| 5,510,748 A | 4/1996 | Erhart et al. .................. 327/530 |
| 5,528,256 A | 6/1996 | Erhart et al. .................. 345/96 |
| 5,572,211 A | 11/1996 | Erhart et al. .................. 341/144 |
| 5,574,475 A | 11/1996 | Callahan, Jr. et al. ....... 345/100 |
| 5,578,957 A | 11/1996 | Erhart et al. .................. 327/333 |
| 5,604,449 A | 2/1997 | Erhart et al. .................... 326/81 |
| 5,703,617 A | 12/1997 | Callahan, Jr. et al. ......... 345/98 |
| 5,719,591 A | 2/1998 | Callahan, Jr. et al. ......... 345/98 |
| 5,726,676 A | 3/1998 | Callahan, Jr. et al. ......... 345/98 |
| 5,754,156 A | 5/1998 | Erhart et al. .................... 345/98 |
| 5,818,252 A | 10/1998 | Fullman et al. ............... 324/765 |
| 5,852,426 A | 12/1998 | Erhart et al. .................... 345/96 |
| 6,040,815 A | 3/2000 | Erhart et al. .................... 345/98 |
| 6,049,246 A | 4/2000 | Kozisek et al. ................. 330/9 |
| 6,118,261 A | * 9/2000 | Erdelyi et al. ................. 323/313 |

* cited by examiner

Primary Examiner—Brian Young
Assistant Examiner—Joseph Lauture
(74) Attorney, Agent, or Firm—Finnegan, Henderson, Farabow, Garrett & Dunner, L.L.P.

(57) ABSTRACT

A digital-to-analog converter is disclosed, which includes a decoder stage having a decoder output capable of receiving input data, a level shifter stage coupled to the decoder output capable of shifting the level of the decoder output, an output stage communicatively coupled to the level shifter stage capable of responding based upon an output value of the level shifter stage, and a current mirror communicatively coupled to the level shifter and capable to shift the level of the decoder output, and further includes an output stage having switches, which are selectively turned on by an output signal from the decoder stage thus outputting a reference voltage.

27 Claims, 2 Drawing Sheets

ANALOG MULTIPLEX LEVEL SHIFTER WITH RESET

PRIORITY

Priority is claimed to the following U.S. provisional patent application:

Provisional U.S. Patent Application No. 60/280,677, entitled "Improved Switching Circuit for Column Display Driver," filed on Mar. 30, 2001.

RELATED APPLICATIONS

The following identified U.S. patent applications are relied upon and are incorporated by reference in this application.

U.S. patent application Ser. No. 10/109,633, entitled "Slew Rate Enhancement and Method," and filed on the same date herewith, which also claims priority to provisional U.S. Patent Application No. 60/280,677.

U.S. patent application Ser. No. 10/109,632, entitled "Improved Switching Circuit for Column Display Driver," and filed on the same date herewith, which also claims priority to provisional U.S. Patent Application No. 60/280, 677.

TECHNICAL FIELD

This disclosure relates generally to transistor circuits and, more particularly, to digital-to-analog converters used for decoding and signal level shifting applications.

BACKGROUND

The liquid crystal display has become well known, driven in part by popular applications such as notebook computers, car navigational displays, and flat panel displays for personal computers. In each of these applications, a column driver circuit enables the operation of each liquid crystal display unit. Liquid crystal displays comprise a plurality of individual picture elements, called pixels, which are uniquely addressable in a row and column arrangement. The column driver circuitry provides the driving voltage to the columns of the liquid crystal display.

Column driver circuitry components act as intermediaries between the digital format of the electronics that process information and the analog format of the display that presents the results to the user. Accordingly, the column driver circuitry includes a digital-to-analog converter ("DAC") that converts digital signals from the processing unit, bus, and memory into analog signals. However, DACs may be used in many applications other than in column driver circuitry.

One type of conventional DAC includes an inverter and a p-channel field effect transistor ("FET") that is used as a feedback element for coupling a decoder circuit, which forms the input of the DAC, to an output stage such as, e.g., a multiplex switch, which forms the output of the DAC. One problem that occurs is that the FETs in a FET stack of the decoder circuit may have difficulty in driving the voltage level at the input of the inverter. As a result, the p-channel FET that forms the feedback element is formed with a large channel length, since the total resistance of the FETs in the FET stack has to be less than the resistance of the feedback FET. This large channel length requires substantial die space.

SUMMARY

In one embodiment of the invention, a digital to analog converter comprises a current source, a level shifter coupled to the current source, a stack of transistors coupled to the level shifter, wherein the stack of transistors is responsive to a reset signal, and an output stage coupled to the level shifter, wherein the output stage includes a transistor forming a path between a reference voltage level and an output voltage.

In another embodiment of the invention, a digital to analog converter comprises a decoder means, and an output means coupled to the decoder means.

In yet another embodiment of the invention, a digital to analog converter comprises a decoder stage, including a level shifter stage coupled to a decoder stage output, and a current source coupled to the level shifter, and an output stage coupled to the decoder stage.

In still another embodiment of the invention, a digital to analog converter comprises a decoder stage including a current source, a level shifter, and a stack of transistors, wherein the level shifter comprises an inverter with a feedback channel, and an output stage coupled to the decoder stage, the output stage including a transistor forming a path between a reference voltage level and an output voltage.

BRIEF DESCRIPTION OF THE DRAWINGS

It is to be understood that both the foregoing general description and the following detailed description are exemplary and explanatory only and are not restrictive of the invention as claimed. The accompanying drawings, which are incorporated in and constitute a part of this specification, illustrate possible embodiments of the invention and together with the description, serve to explain the principles of the invention. In the drawings:

DETAILED DESCRIPTION

Figure 1:
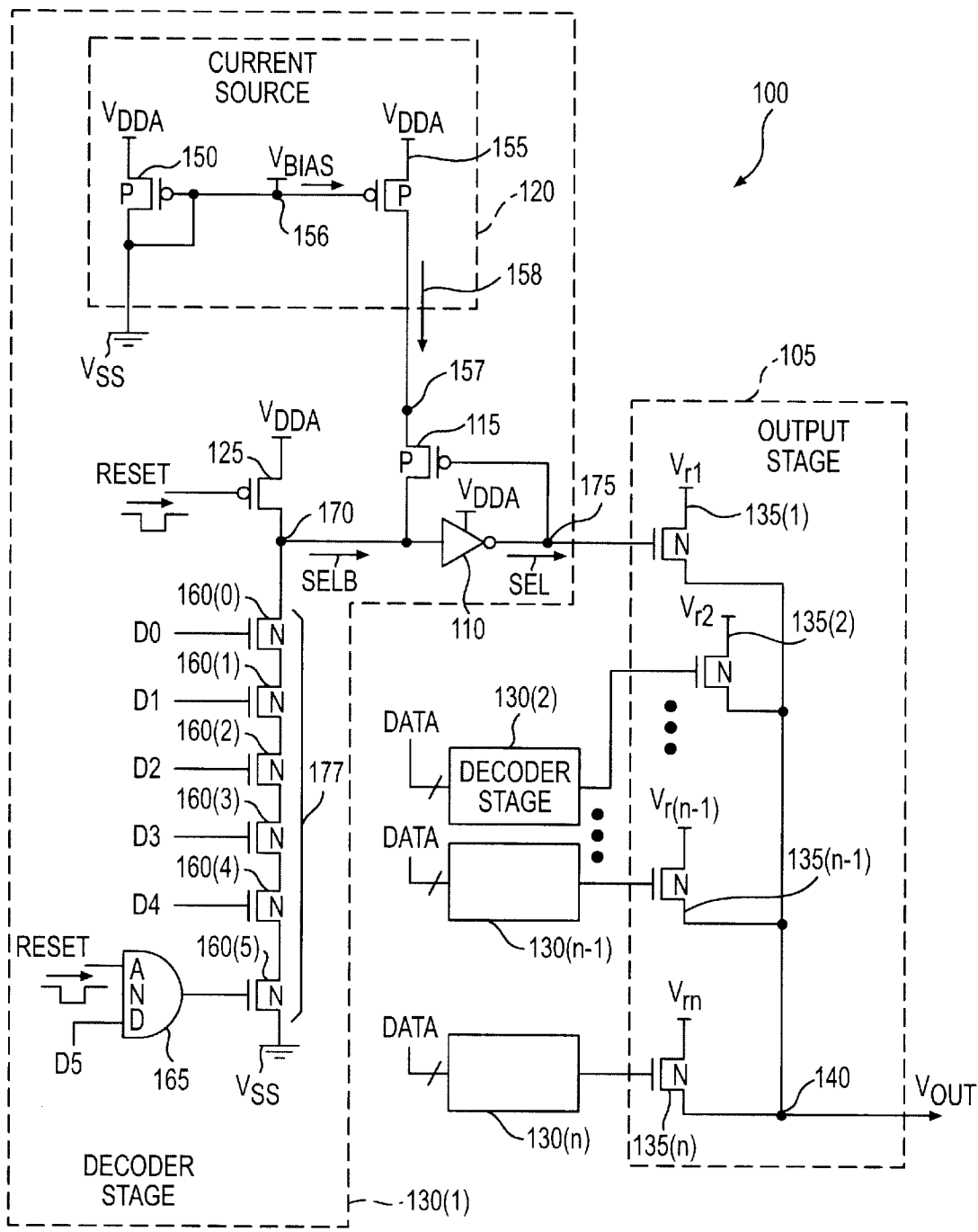
FIG. 1 is a schematic circuit diagram consistent with an embodiment of the present invention.

Referring in detail now to the drawings, FIG. 1 shows a schematic block diagram of a digital-to-analog converter ("DAC") 100 consistent with an embodiment of the invention. DAC 100 includes an output stage 105 for generating an analog output voltage $V_{OUT}$, and one or more decoder stages 130($i$) (where, i=1, 2, . . . , n). As another example, in a typical 6-bit application, one implementation of DAC 100 would include sixty-four (64) decoder stages 130($i$) (where, i=1, 2, . . . , 64) for controlling output stage 105. However, the number of decoder stages 130($i$) may also vary (e.g., i=1, 2, . . . , 32) in a 6-bit application. As described below, decoder stage 130($i$) further comprises a level shifter.

Output stage 105 includes an n-channel transistor 135($i$) (where, i=1, 2, . . . , n) that functions as a switch. Generally, transistor 135($i$) has a drain connected to a voltage source with a value of $V_{ri}$ (where, i=1, 2, . . . , n), a gate connected to the output of decoder stage 130($i$), and source connected to an output node 140. That is, transistor 135($l$) has a drain connected to a voltage source with a value of $V_{rl}$, a gate connected to the output of decoder stage 130($l$) and a source connected to output node 140. Transistor 135($n-l$) has a drain connected to a voltage source with a value of $V_{r(n-1)}$, a gate connected to the output of decoder stage 130($n-l$), and source connected to output node 140. Transistor 135($n$) has a drain connected to a voltage source with a value of $V_{rn}$, a gate connected to the output of decoder stage 130($n$), and a source connected to output node 140. Voltages $V_{r1}$, $V_{r2}, \ldots V_{r(n-1)}$, and $V_{rn}$ provide a series of reference voltage levels as an output. An output voltage ("$V_{OUT}$") detected at node 140 is output from output stage 105. The output voltage $V_{OUT}$ can range from approximately zero (0) volt to approximately the positive voltage source value $V_{DDA}$. As an example, $V_{DDA}$ may have a value of about 12.0 volts.

Decoder stage 130(i) includes a current source 120, a feedback p-channel transistor 115, an analog inverter 110, a pre-charge p-channel transistor 125, and a stacked n-channel transistor 160(j) (where, j=0, 1, 2, ..., m), which form a path 177 between a node 170 and $V_{SS}$. Current source 120 may be a current mirror. Current source 120 may include a p-channel transistor 150 with a source connected to a voltage source $V_{DDA}$ and a drain connected to $V_{SS}$. Transistor 150 is diode-connected with its gate tied to its drain. Current source 120 also includes a p-channel transistor 155 with a source connected to the $V_{DDA}$ voltage source, a gate connected to the gate of transistor 150 at node 156 and is biased by bias voltage $V_{BIAS}$, and a drain connected to the source of transistor 115 at node 157.

The drain of transistor 115 is coupled to the input of inverter 110, the output of which is coupled to the gate of transistor 115. Inverter 110 also may receive $V_{DDA}$ as an input when transistor 125 is turned on. Inverter 110 is biased between a first voltage supply $V_{DDA}$ and a second voltage supply $V_{SS}$ where $V_{SS}$ may be a negative, positive, or ground voltage and where $V_{DDA}$ has a higher potential than $V_{SS}$. The drain of transistor 115 is further coupled to the drain of transistor 125, which has its source coupled to $V_{DDA}$ and its gate configured to receive a reset signal ("RESET"). Thus, during a reset operation of decoder stage 130(i), a negative RESET pulse will turn on transistor 125 to pull up node 170 to $V_{DDA}$. The drain of transistor 125 is further coupled to the source of transistor 160(j). Transistor 160(j) has its drain coupled to $V_{SS}$. The gate of transistor 160(j) (where, j=0, 2, ..., (m-1)) is coupled to a data input signal Dj (where, j=0, 2, ..., (m-1)). The number of transistors 160(j) (i.e., the value of m) in decoder stage 130(i) maybe varied in order to configure decoder stage 130(i) to receive various numbers of input signals. The gate of transistor 160(m) is coupled to the output of an AND gate 165, which has inputs of RESET and Dj (where, j=m).

Each decoder stage 130(i) functions as a logic decoder with a level shifter. In the embodiment shown in FIG. 1, the output signal at node 170, which is coupled to transistors 125 and 160(j) of decoder stage 130(i) (e.g., signal SELB) can be a low signal (pulled to ground) or can be a high impedance (Z) output.

Each of the input data received at terminals Dj (where, j=0, 1, 2, ..., m) will have a logic high or logic low level. A logic high level signal will turn on an n-channel transistor in the transistor stack in decoder stage 130(i), while a logic low level signal will turn off an n-channel transistor in the transistor stack. As an example, if DAC 100 is being used in a column driver application, the input data provided at terminals D0 through D5 are obtained from a data storage register (not shown). In a column driver application, the data stored in the data storage register at a given time would represent the intensity desired for one pixel in a given line.

In order to trip, or set, on decoder stage 130(i), all of n-channel transistors 160(l) through 160(m) must turn on, and the SELB signal at node 170 will be pulled to ground. The values of the input data provided at terminals D0 through Dm determine whether or not decoder stage 130(i) will trip. When decoder stage 130(i) trips, SELB will go low and will be inverted by inverter 110 to output a high SEL signal. The high SEL signal will input to output stage 105 and turn on corresponding transistor 135(i) to set the $V_{OUT}$ output voltage value to $V_{ri}$. For a given input data that is received by one of decoder stage 130(i), only one of transistors 135(i) in the output stage 105 will turn on to determine the $V_{OUT}$ output signal value.

The series layout of transistor 115 and transistor 155 will be smaller in size than if, instead, feedback transistor 115 were made weak. If transistor 115 is made weak, the width W will be very small and the length L will be long in the W/L ratio for MOSFETs. The long length L takes up a significant amount of die area, particularly if there are many decoder stages 130(i) in particular implementations. In contrast, according to an embodiment of the invention, the W/L ratio is made small for feedback transistor 115 (i.e., minimum L and minimum W for transistor 115). However, this configuration would make transistor 115 too strong if L is not long enough, and a strong transistor 115 will not permit stacked transistors 160(j) to pull down node 170 during a set operation. In an embodiment of the invention, L was minimized for transistor 155 and this minimization reduced the required die space for transistor 115. To weaken the path at node 157, current source 120 is coupled in series with feedback transistor 115. The voltage $V_{BIAS}$ at node 156 could be adjusted to set a current 158 value, which flows from current source 120.

Reset Operation

A reset operation occurs when a low logic pulse in the RESET is received by transistor 125 and by AND gate 165. The low logic RESET will turn on transistor 125 and will cause AND gate 165 to output a low logic signal to turn off transistor 160(m), or in this case transistor 160(5). As a result, path 177 becomes disconnected since transistor 160(m) is turned off by the low logic signal from AND gate 165. Node 170 is therefore pulled by transistor 125 to $V_{DDA}$ since transistor 125 will turn on and path 177 is disconnected by transistor 160(m).

Each of decoder stages 130(i) (where, i=1, 2, ..., n) receives the low logic RESET during a reset operation and functions as described above during the reset operation.

Since node 170 is pulled high during reset, the SELB signal is pulled high. Inverter 110 will invert the high SELB signal into a low SEL signal that turns off transistor 135(i) in output stage 105. Typically, the trip point voltage $V_{TRIP}$ of inverter 110 (i.e., when inverter 110 output switches from one logic level to the opposite logic level) is when the input signal of inverter 110 reaches a value that is less than one-half (½) of the supply voltage $V_{DDA}$ that powers inverter 110. The low SEL signals from each of decoder stages 130(i) (where, i=1, 2, ..., n) will also turn off the corresponding output stage transistors 135(i) (where, i=1, 2, ..., n).

The low SEL signal will turn on transistor 115 and will cause transistor 115 to pull node 170 to $V_{DDA}$. This action by transistor 115 thus reinforces the reset action by permitting current source 120 to hold node 170 to a high level and avoids the problems of the dynamic-type reset.

It is also noted that when SELB is high and thus SEL is low, transistor 115 is on. Since the drain of transistor 115 (connected to node 170) and the source of transistor 115 (connected to node 157) are at the same voltage level of VDDA, current source 120 shuts off and will not supply current.

Select Operation

Prior to the select operation, the SELB signal may be pre-charged high such that the SEL signal is at a low level.

The low level SEL maintains transistor 115 in an on state. Thus, nodes 157 and 170 are both at the $V_{DDA}$ voltage level, and this condition keeps current source 120 in an off state. When the input signals at the gates of transistors 160(j) are high, each of transistors 160(j) will turn on. As a result, stacked transistors 160(0) through 160(m) will pull node 170 to a low level of $V_{SS}$, resulting in the SELB signal to change from a high level to a low level. When the SELB signal decreases from the $V_{DDA}$ level to the $V_{TRIP}$ trip point voltage of inverter 110, the voltage at node 157 will also decrease from $V_{DDA}$ to the $V_{TRIP}$ trip point voltage. When the SELB signal decreases to the $V_{TRIP}$ trip point voltage, inverter 110 will switch the SEL output signal from a low level to a high level. The high level SEL signal will turn off transistor 115. Since transistor 115 is turned off, stacked transistors 160(0) through 160(m) can easily continue to pull down the SELB signal to the ground level. The low SELB signal is inverted into a high SEL signal that turns on the output stage transistor 135(i). Since transistor 135(i) is on, the output voltage $V_{OUT}$ will be approximately equal to $V_{ri}$. Since transistor 115 is off, the current 158 from current source 120 will pull node 157 to the $V_{DDA}$ level. After node 157 is pulled to the $V_{DDA}$ level, current source 120 will shut off.

Figure 2:
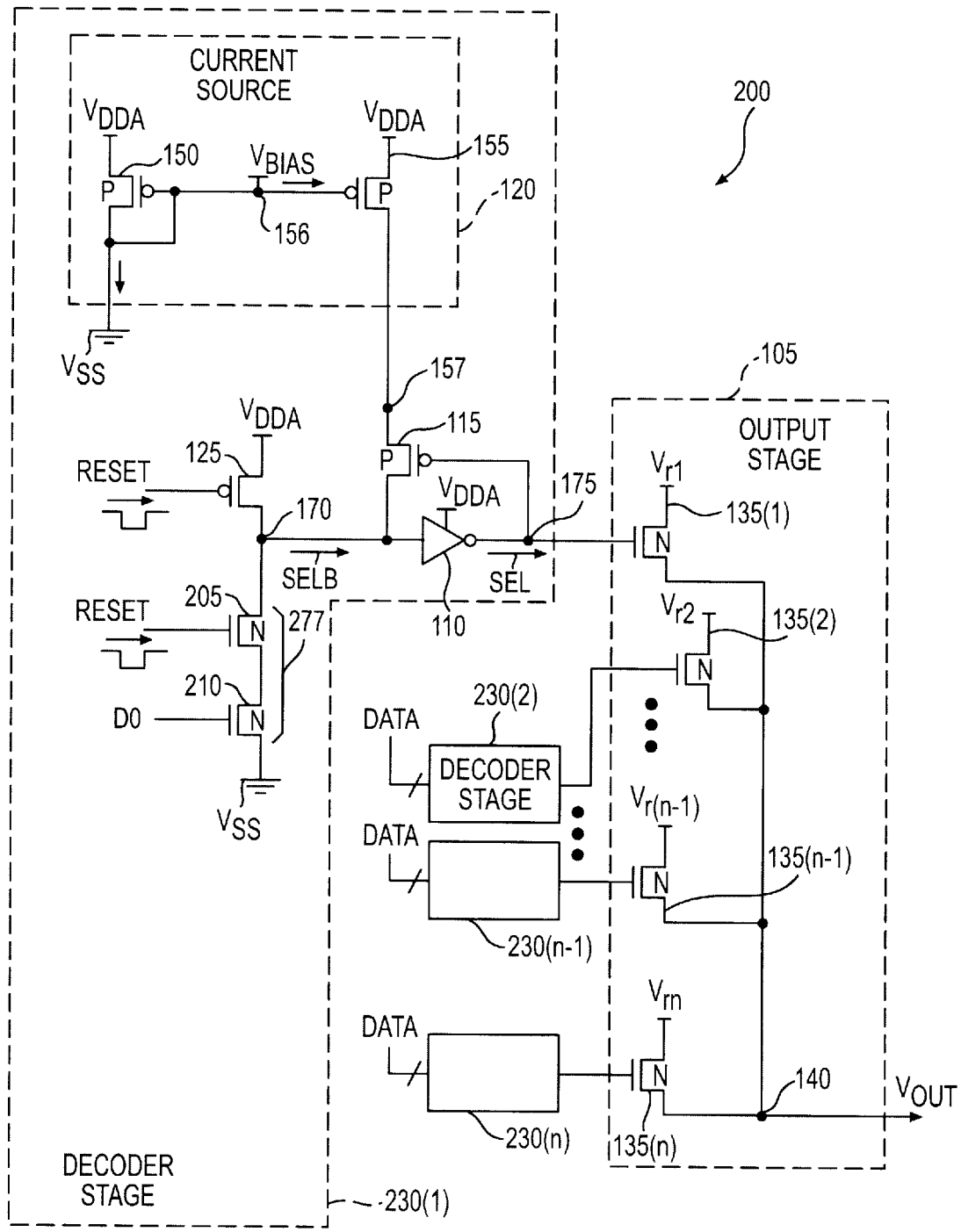
FIG. 2 is a schematic circuit diagram consistent with another embodiment of the present invention.

Decoder stage 130(i) can have other configurations. For example, FIG. 2 is a schematic circuit diagram of another embodiment of the decoder that can be implemented with the invention. Decoder stage 230(i) (where, i=1, 2, ..., n) includes a reset n-channel transistor 205 with a gate for receiving the RESET signal and a drain coupled to node 170. Decoder stage 230(i) also includes an n-channel transistor 210 with a gate for receiving data, a drain connected to the source of transistor 205, and a source connected to ground, or $V_{SS}$. In a reset operation, transistor 205 receives the low pulse from the RESET signal to turn off transistor 205 and disconnect a path 277, which comprises transistors 205 and 210, from node 170 to ground. The low RESET pulse will also turn on transistor 125 so that node 170 is pulled to $V_{DDA}$. During a select operation, the input data will turn on transistor 210 and node 170 will be pulled to ground. The SELB signal will go low and the SEL signal will go high to turn on output stage transistor 135(i). As similarly with reference to FIG. 1 described above, the high SEL signal will turn off feedback transistor 115 and node 157 will be pulled to the $V_{DDA}$ level.

Other variations and modifications of the above-described embodiments and methods are possible in light of the foregoing teaching. For example, components of this invention may be implemented using field programmable gate arrays (FPGAs), application specific integrated circuits (ASICs), discrete elements, or a network of interconnected components and circuits. Connections may be wired, wireless, modem, and the like.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A digital-to-analog converter, comprising:
   a current source;
   a first voltage source;
   a second voltage source having a lower voltage than the first voltage source;
   a level shifter having a first terminal and a second terminal, the first terminal being coupled to the current source;
   a plurality of transistors, wherein at least one of the plurality of transistors is coupled to the level shifter and responsive to a reset signal; and
   an output stage coupled to the second terminal of the level shifter, wherein the output stage includes an output stage transistor for receiving a reference voltage and providing an analog output voltage, wherein the analog output voltage has a voltage value between that of the first and second voltage sources.

2. The digital-to-analog converter of claim 1, wherein the output stage transistor functions as a switch.

3. The digital-to-analog converter of claim 1, wherein the plurality of transistors includes at least one transistor having a gate for receiving the reset signal.

4. The digital-to-analog converter of claim 1, wherein the current source comprises a current mirror.

5. The digital-to-analog converter of claim 1, wherein the current source comprises a second transistor having a source and a drain each coupled to one of the first voltage source and the second voltage source, and a gate coupled to one of the source and drain.

6. The digital-to-analog converter of claim 5, wherein the current source further comprises a third transistor having one of source and drain coupled to the first voltage source, a gate coupled to the gate of the second transistor, and the other one of source and drain coupled one of the source and drain of the second transistor.

7. The digital-to-analog converter of claim 6, wherein the gate of the third transistor is coupled to a bias voltage source.

8. The digital-to-analog converter of claim 1, further comprising a fourth transistor having one of source and drain coupled to the first voltage source, the other one of the source and drain coupled to the level shifter, and a gate for receiving a reset signal.

9. The digital-to-analog converter of claim 8, wherein the fourth transistor is capable of providing the first voltage source to the level shifter.

10. The digital-to-analog converter of claim 1, wherein the second voltage source is ground.

11. The digital-to-analog converter of claim 1, wherein the level shifter comprises an inverter having an input terminal and an output terminal, the inverter being biased between the first voltage source and the second voltage source.

12. The digital-to-analog convert of claim 11, wherein the level shifter further comprises a fifth transistor having one of source and drain coupled to the current source, the other one of source and drain coupled to the input terminal of the inverter, and a gate coupled to the output terminal of the inverter.

13. The digital-to-analog converter of claim 1, further comprising a logic gate for receiving data and the reset signal, wherein the logic gate is coupled to the gate of at least one of the plurality of transistors.

14. The digital-to-analog converter of claim 1, wherein each of the plurality of transistors is configured to receive a data bit.

15. A digital-to-analog converter, comprising:
   means for providing a current;
   means for shifting voltage levels coupled to the current source means, wherein the voltage level shifting means includes an inverter means;
   a plurality of transistors, wherein at least one of the plurality of transistors is coupled to the voltage level shifting means and responsive to a reset signal, and wherein each of the plurality of transistors receives a data bit; and output means coupled to the voltage level shifting means for providing an analog output voltage.

16. The digital-to-analog converter of claim 15, wherein the plurality of transistors include a first transistor having a drain coupled to a source of a second transistor, and wherein gates of the first and second transistors receive data bits.

17. A digital-to-analog converter of claim 15, further comprising a pre-charging means coupled to the voltage level shifting means for receiving the reset signal and providing a signal to the voltage level shifting means.

18. The digital-to-analog converter of claim 15, further comprising a logic means coupled to at least one of the plurality of transistors for receiving the reset signal and providing an output to the at least one of the plurality of transistors.

19. A digital-to-analog converter, comprising:
   a current source;
   a level shifter coupled to the current source, wherein the level shifter comprises an inverter with a feedback channel;
   a plurality of transistors coupled to the level shifter for receiving at least two data bits; and
   an output stage coupled to the level shifter, wherein the output stage includes an output stage transistor for receiving a reference voltage and providing an analog output voltage.

20. The digital-to-analog converter of claim 19, wherein the current source includes a first transistor, a second transistor, and a bias voltage, wherein the first transistor has a first source coupled to a first voltage source, a drain coupled to a second voltage source, and a gate coupled to the drain, the second transistor has a source coupled to the first voltage source, a drain coupled to the level shifter, and a gate coupled to the gate of the first transistor, and wherein the bias voltage is coupled to the gates of the first and second transistors.

21. The digital-to-analog converter of claim 19, wherein the output stage transistor is an n-channel transistor having a drain for receiving the reference voltage, a source for providing the analog output voltage, and a gate for receiving an output signal from the level shifter.

22. The digital-to-analog converter of claim 19, further comprising a third transistor having a source coupled to a first voltage source, a drain coupled to a source of at least one of the plurality of transistors and the level shifter, and a gate for receiving the reset signal, wherein the third transistor provides a voltage from the first voltage source to the level shifter.

23. A method of performing digital to analog conversion, comprising:
   providing a current source;
   providing a level shifter coupled to the current source;
   providing a reset signal;
   providing a plurality of transistors responsive to the reset signal;
   coupling at least one of the plurality of transistors to the level shifter; and
   providing an output stage coupled to the level shifter for providing an analog output voltage.

24. The method of claim 23, further comprising
   providing a first transistor coupled to the level shifter,
   providing a first voltage to one of source and drain of the first transistor, and
   providing a reset voltage to a gate of the first transistor, wherein the first transistor providing the first voltage to the level shifter.

25. The method of claim 23, further comprising a step of biasing the level shifter between a first voltage source and a second voltage source having a voltage level lower than that of the first voltage source.

26. A method of selecting a digital-to-analog converter, comprising:
   providing a current source in an off state;
   providing a level shifter coupled to the current source;
   providing a plurality of transistors in series;
   coupling at least one of a source and drain of one of the plurality of transistors to the level shifter;
   turning on at least one of the plurality of transistors;
   providing a first transistor coupled to the level shifter;
   providing a first voltage to one of a source and drain of the first transistor;
   providing an output stage coupled to the level shifter for providing an analog output voltage; and
   turning on the output stage.

27. A method of resetting a digital-to-analog converter, comprising:
   providing a current source;
   providing a level shifter coupled to the current source;
   providing a plurality of transistors;
   coupling at least one of the plurality of transistors to the level shifter;
   providing a first transistor coupled to the level shifter;
   providing a first voltage to one of a source and drain of the first transistor;
   providing a reset voltage to a gate of the first transistor to turn on the first transistor;
   providing a reset voltage to turn off at least one of the plurality of transistors; and
   providing an output stage coupled to the level shifter for providing an analog output voltage.

* * * * *